United States Patent
Suzuki et al.

(10) Patent No.: US 9,599,682 B2
(45) Date of Patent: Mar. 21, 2017

(54) VERTICAL HALL ELEMENT

(71) Applicant: SEIKO INSTRUMENTS INC., Chiba-shi, Chiba (JP)

(72) Inventors: Satoshi Suzuki, Chiba (JP); Mika Ebihara, Chiba (JP); Takaaki Hioka, Chiba (JP)

(73) Assignee: SII Semiconductor Corporation (JP)

( * ) Notice: Subject to any disclaimer, the term of this patent is extended or adjusted under 35 U.S.C. 154(b) by 0 days.

(21) Appl. No.: 14/943,493

(22) Filed: Nov. 17, 2015

(65) Prior Publication Data
US 2016/0146906 A1 May 26, 2016

(30) Foreign Application Priority Data

Nov. 26, 2014 (JP) .................... 2014-239333
Sep. 29, 2015 (JP) .................... 2015-191873

(51) Int. Cl.
*G01R 33/07* (2006.01)
*H01L 43/14* (2006.01)
*H01L 43/06* (2006.01)
*H01L 43/12* (2006.01)

(52) U.S. Cl.
CPC .......... *G01R 33/077* (2013.01); *G01R 33/07* (2013.01); *G01R 33/072* (2013.01); *G01R 33/075* (2013.01); *H01L 43/065* (2013.01); *H01L 43/06* (2013.01); *H01L 43/12* (2013.01); *H01L 43/14* (2013.01)

(58) Field of Classification Search
CPC ....... H01L 43/06; H01L 43/065; H01L 43/12; H01L 43/14; G01R 33/07; G01R 33/072; G01R 33/075; G01R 33/077
See application file for complete search history.

(56) References Cited

U.S. PATENT DOCUMENTS

| 2005/0230770 A1* | 10/2005 | Oohira | G01R 33/07 257/421 |
| 2006/0028204 A1* | 2/2006 | Oohira | G01R 33/077 324/207.25 |
| 2008/0074106 A1* | 3/2008 | Oohira | G01R 33/07 324/209 |
| 2009/0295375 A1* | 12/2009 | Oohira | G01D 5/145 324/207.21 |

FOREIGN PATENT DOCUMENTS

| JP | 01251763 A | * | 10/1989 |
| JP | 2006024647 A | * | 1/2006 |
| JP | 2006108448 A | * | 4/2006 |
| JP | 2007027515 A | * | 2/2007 |

OTHER PUBLICATIONS

Popovic, R. S. "Hall Effect Devices, $2^{nd}$ Edition" 2003, pp. 171-177.
Abstract, Publication No. 2008-022022, Publication Date Jan. 31, 2008.

* cited by examiner

*Primary Examiner* — Ermias Woldegeorgis
(74) *Attorney, Agent, or Firm* — Adams & Wilks

(57) ABSTRACT

Provided is a highly sensitive vertical Hall element without increasing a chip area. In the vertical Hall element, trenches each filled with an insulating film are formed between a first current supply end and voltage output ends, respectively, which enables the restriction of current flow into the voltage output ends to increase the ratio of a current component perpendicular to a substrate surface, resulting in enhanced sensitivity.

18 Claims, 18 Drawing Sheets

VERTICAL HALL ELEMENT

BACKGROUND OF THE INVENTION

1. Field of the Invention

The present invention relates to a semiconductor Hall element. More particularly, the present invention relates to a vertical Hall element configured such that current containing a component perpendicular to a surface of a semiconductor substrate is supplied to a magnetic sensing portion in the semiconductor substrate and a magnetic field component in parallel with a surface of the semiconductor substrate is detected through Hall voltage generated in relation to the current.

2. Description of the Related Art

A magnetic detection principle of a Hall element is described with reference to FIG. 4.

When current is passed through a semiconductor Hall element (Hall plate) in the shape of a rectangular parallelepiped having a length L, a width W, and a thickness d as illustrated in FIG. 4 in a direction of the length L and a magnetic field is applied perpendicularly to the flowing current, that is, in a direction of the thickness d, carriers that are electrons or holes flowing as the current are deflected by the Lorentz force in a direction perpendicular both to the applied magnetic field and to a travelling direction of the carriers, increasing the carriers at one end (accumulation) and reducing the carriers at another end in a direction of the width W. Accordingly, charge accumulates at the one end in the direction W that is perpendicular both to the direction of the current and to the direction of the magnetic field, and an electric field is generated along the direction W. Voltage generated by the electric field is called Hall voltage.

The generated Hall voltage VH is represented as:

$$VH = (RHIB/d)\cos\theta, RH = 1/(qn), \text{ or}$$

$$VH = \mu(W/L)VinB \cos\theta,$$

where Vin is a voltage applied by a power supply for passing a current I through the magnetic sensing portion, B is a density of a magnetic flux applied to the Hall element, e is an angle formed by a normal to the surface of the Hall element and the applied magnetic field, RH is the Hall coefficient, q is the charge of the carriers, n is a carrier concentration, and p is a carrier drift mobility. A ratio of the Hall voltage to the density of the applied magnetic flux is called sensitivity. It can be seen that, from the above expressions, in order to enhance the sensitivity per unit Hall current (so-called product sensitivity), it is effective to reduce d of the Hall plate or to reduce the carrier concentration. Further, in order to enhance the sensitivity per unit Vin, it is effective to increase W/L or to increase the mobility.

Potential distribution in the Hall element in the shape of such a rectangular parallelepiped is now reviewed. As described in R. S. Popovic "HALL EFFECT DEVICES, 2nd Edition" 2003, due to the Hall effect, charge accumulates at the one end of the magnetic sensing portion in the direction W, and an equipotential surface bends from a direction in parallel with current supply ends. It can be seen that the extent of the bend becomes larger as the distance from the current supply ends becomes larger, and thus, the largest Hall voltage is obtained when the voltage output is taken at about the center of the magnetic sensing portion in the direction L.

As a typical Hall element, a Hall element described in, for example, Kazusuke Maenaka, et al. "Integrated Three-Dimensional Magnetic Sensors" Trans. IEE Jpn. 109-C (1989), vol. 7, pp. 483-490, that is, a so-called horizontal Hall element, is known. The horizontal Hall element detects a magnetic field component perpendicular to a substrate surface.

FIG. 5A and FIG. 5B are illustrations of a typical horizontal Hall element. FIG. 5A is a plan view of the element, and FIG. 5B is a sectional view taken along the line L1-L1 of FIG. 5A. In the structure, for example, an n-type epitaxial layer 104, a well, or the like serving as a magnetic sensing portion is formed on a p-type substrate 103, and electrodes 105 that are heavily doped impurity regions are formed in four corners on a surface of the substrate. Current is passed between electrodes 105 in a pair formed on a diagonal line. At this time, current flows through the magnetic sensing portion in a direction in parallel with the substrate surface. The current generates the Hall voltage corresponding to the magnetic field in a direction perpendicular to the substrate surface. Through detection of the Hall voltage generated between electrodes in another pair formed on another diagonal line orthogonal to the diagonal line, the strength of the applied magnetic field can be determined.

In recent years, in addition to the horizontal Hall element, there is a vertical Hall element configured to detect a magnetic field in a direction in parallel with the substrate surface. In the case of the vertical Hall element, as described in Kazusuke Maenaka, et al. "Integrated Three-Dimensional Magnetic Sensors" Trans. IEE Jpn. 109-C (1989), vol. 7, pp. 483-490, by passing, through the magnetic sensing portion, current containing a component in the direction perpendicular to the substrate surface, the magnetic field in parallel with the substrate surface can be detected. The operating principles of the vertical Hall element and the horizontal Hall element are different only in the directions of the current and the magnetic field with respect to the substrate surface, and the principle of generating the Hall voltage is the same.

FIG. 6A to FIG. 6C are illustrations of a typical vertical Hall element. FIG. 6A is a plan view of the element, FIG. 6B is a sectional view taken along the line L1-L1 of FIG. 6A, and FIG. 6C is a sectional view taken along the line L2-L2 of FIG. 6A. On the substrate 103 of the first conductivity type, the epitaxial layer 104 of a second conductivity type opposite to that of the substrate is formed. A buried layer 106 that is a heavily doped impurity region of the second conductivity type that is the same as that of the epitaxial layer 104 is formed at the bottom of the epitaxial layer 104. Current supply ends 11 to 13 and voltage output ends 14 and 15 are both formed as heavily doped impurity regions. When voltage is applied between the current supply end 12 and the current supply ends 11 and 13, current flows between the current supply end 12 and the current supply ends 11 and 13 via the buried layer 106, and thus, current flowing between the current supply end 12 and the buried layer 106 perpendicularly to the substrate surface is obtained. As illustrated in FIG. 6A, the voltage output ends 14 and 15 are formed so as to be symmetrical with respect to the current supply end 12, and thus, when a magnetic field containing a component in parallel with the substrate surface is applied to the current, due to the Hall effect described above, the Hall voltage corresponding to the magnetic field is generated between the voltage output end 14 and the voltage output end 15. Therefore, through detection of voltage generated between the voltage output ends 14 and 15, the component of the applied magnetic field in the direction in parallel with the substrate surface can be determined.

Note that, the Hall plate illustrated in FIG. 4 in the shape of a rectangular parallelepiped in which the current density is constant throughout the element is only ideal, and does not establish itself in an actual horizontal or vertical Hall element. In the case of the vertical Hall element illustrated in FIG. 6A to FIG. 6C, the current density is concentrated immediately below the center current supply end 12 in the direction perpendicular to the substrate surface, and, as the distance from the electrode at the center increases, the current density sharply reduces. In a region in which the extent of the reduction is large, that is, around the current supply end 12 at the center, outflow/inflow difference of the carriers due to the Lorentz force is large, and thus, more charge is thought to accumulate. It follows that, through detection of the voltage in this region, the sensitivity is expected to be enhanced.

However, in a vertical Hall element configured to detect a magnetic field in a direction in parallel with the substrate surface based on current in a direction perpendicular to the substrate surface, a flow of current into a voltage output end for detecting the Hall voltage leads to a loss in obtaining current perpendicular to the substrate surface, and reduces the sensitivity. Therefore, it is important to restrict a flow of current into a voltage output end as much as possible, and measures such as forming voltage output ends away from current supply ends have been hitherto taken. However, this method leads to an increase in chip area. Further, increasing w/L in order to enhance the sensitivity per Vin also leads to an increase in chip area.

SUMMARY OF THE INVENTION

The present invention has been made in view of the above-mentioned problems, and an object of the present invention is to provide a vertical Hall element having improved sensitivity without increasing the chip area.

In order to solve the above-mentioned problems, the present invention employs the following measures.

A vertical Hall element according to one embodiment of the present invention includes:
  a semiconductor substrate;
  an n-type semiconductor layer formed on the semiconductor substrate;
  an n-type buried layer formed at a bottom of the n-type semiconductor layer;
  a first current supply end formed above the n-type buried layer;
  a pair of second current supply ends formed in a surface of the n-type semiconductor layer so as to be on both sides of and symmetrical with respect to the first current supply end;
  a pair of voltage output ends formed in the surface of the n-type semiconductor layer so as to be on both sides of and symmetrical with respect to the first current supply end and so that a line connecting the pair of voltage output ends is perpendicular to a line connecting the pair of second current supply ends; and
  trenches formed in the n-type semiconductor layer between the first current supply end and one of the pair of voltage output ends and between the first current supply end and another of the pair of voltage output ends, respectively, each of the trenches being filled with an insulating film.

Further, a vertical Hall element according to another embodiment of the present invention includes:
  a semiconductor substrate;
  an n-type semiconductor layer formed on the semiconductor substrate;
  an n-type buried layer formed at a bottom of the n-type semiconductor layer;
  a first current supply end formed above the n-type buried layer;
  a pair of second current supply ends formed in a surface of the n-type semiconductor layer so as to be on both sides of and symmetrical with respect to the first current supply end;
  a pair of voltage output ends formed in the surface of the n-type semiconductor layer so as to be on both sides of and symmetrical with respect to the first current supply end and so that a line connecting the pair of voltage output ends is perpendicular to a line connecting the pair of second current supply ends; and
  field insulating films formed in the n-type semiconductor layer between the first current supply end and one of the pair of voltage output ends and between the first current supply end and another of the pair of voltage output ends, respectively.

Still further, a vertical Hall element according to another embodiment of the present invention includes:
  a semiconductor substrate;
  an n-type semiconductor layer formed on the semiconductor substrate;
  an n-type buried layer formed at a bottom of the n-type semiconductor layer;
  a first current supply end formed above the n-type buried layer;
  a pair of second current supply ends formed in a surface of the n-type semiconductor layer so as to be on both sides of and symmetrical with respect to the first current supply end;
  a pair of voltage output ends formed in the surface of the n-type semiconductor layer so as to be on both sides of and symmetrical with respect to the first current supply end and so that a line connecting the pair of voltage output ends is perpendicular to a line connecting the pair of second current supply ends; and
  p-type diffusion layers formed in the n-type semiconductor layer between the first current supply end and one of the pair of voltage output ends and between the first current supply end and another of the pair of voltage output ends, respectively.

With the above-mentioned measures, in the vertical Hall element according to the embodiments of the present invention, a component of current flowing perpendicularly to a substrate surface relatively increases in a Hall element magnetic sensing portion, and sensitivity of the vertical Hall element is improved.

BRIEF DESCRIPTION OF THE DRAWINGS

FIG. 1A is a plan view, FIG. 1B is a sectional view taken along the line L1-L1 of FIG. 1A, and FIG. 1C is a sectional view taken along the line L2-L2 of FIG. 1A.

FIG. 2A is a plan view, FIG. 2B is a sectional view taken along the line L1-L1 of FIG. 2A, and FIG. 2C is a sectional view taken along the line L2-L2 of FIG. 2A.

FIG. 3A is a plan view, FIG. 3B is a sectional view taken along the line L1-L1 of FIG. 3A, and FIG. 3C is a sectional view taken along the line L2-L2 of FIG. 3A.

FIG. 5A is a plan view for schematically illustrating a structure of the Hall element, and FIG. 5B is a sectional view taken along the line L1-L1 of FIG. 5A.

FIG. 6A is a plan view, FIG. 6B is a sectional view taken along the line L1-L1 of FIG. 6A, and FIG. 6C is a sectional view taken along the line L2-L2 of FIG. 6A.

FIG. 8A is a plan view, FIG. 8B is a sectional view taken along the line L1-L1 of FIG. 8A, and FIG. 8C is a sectional view taken along the line L2-L2 of FIG. 8A.

FIG. 9A is a plan view, FIG. 9B is a sectional view taken along the line L1-L1 of FIG. 9A, and FIG. 9C is a sectional view taken along the line L2-L2 of FIG. 9A.

FIG. 10A is a plan view, FIG. 10B is a sectional view taken along the line L1-L1 of FIG. 10A, and FIG. 10C is a sectional view taken along the line L2-L2 of FIG. 10A.

DETAILED DESCRIPTION OF THE EMBODIMENTS

First Embodiment

Figure 1A:
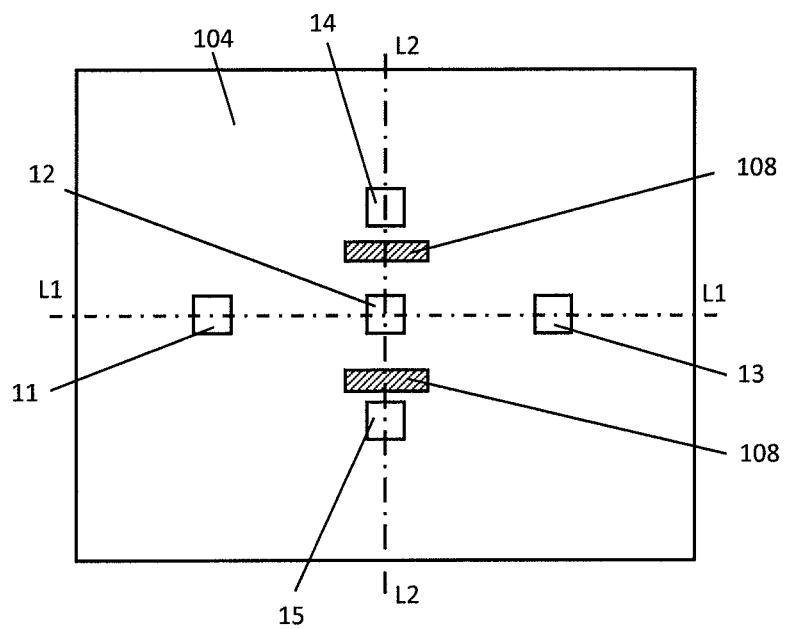
FIG. 1A to FIG. 1C are schematic views for illustrating a vertical Hall element according to a first embodiment of the present invention.
Figure 1B:
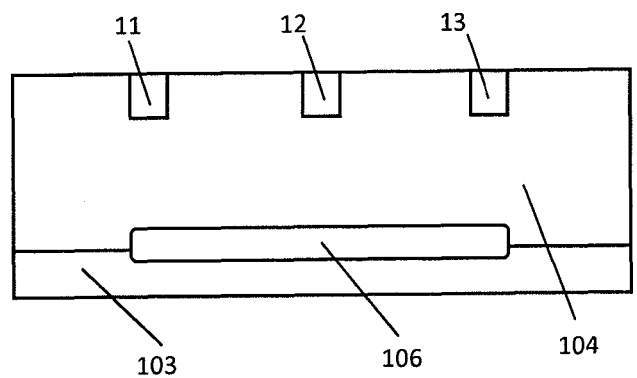
Figure 1C:
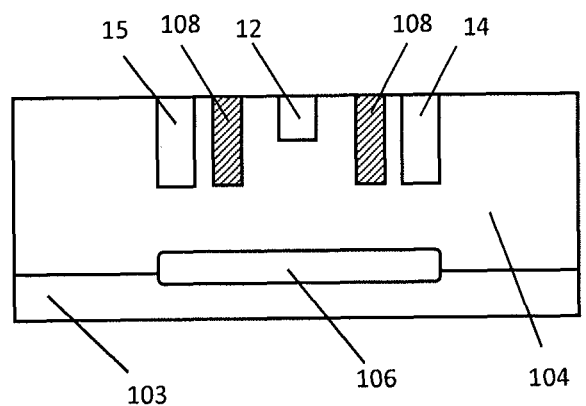

FIG. 1A to FIG. 1C are schematic views for illustrating a vertical Hall element according to a first embodiment of the present invention. FIG. 1A is a plan view, FIG. 1B is a sectional view taken along the line L1-L1 of FIG. 1A, and FIG. 1C is a sectional view taken along the line L2-L2 of FIG. 1A.

An epitaxial layer 104 that is an n-type semiconductor layer serving as a magnetic sensing portion is formed on a p-type semiconductor substrate 103. An n-type impurity layer (buried layer) 106 having an impurity concentration higher than that of the epitaxial layer 104 is formed at the bottom of the epitaxial layer 104 in contact with the p-type semiconductor substrate 103. Current supply ends 11 to 13 for supplying Hall current and voltage output ends 14 and 15 for detecting Hall voltage are heavily doped n-type impurity layers, and are arranged from a surface of the epitaxial layer 104 to inside of the epitaxial layer 104. The buried layer 106 is formed beneath the regions of the current supply ends 11 to 13 in plan view. Specifically, the current supply ends 11 to 13 are formed from the surface of the epitaxial layer 104 to inside of the epitaxial layer 104 above the buried layer 106. Further, the second current supply ends 11 and 13 in a pair are formed on both sides of the first current supply end 12 to be symmetrical with respect to the first current supply end 12 in plan view. Similarly, the voltage output ends 14 and 15 in a pair are formed on both sides of the first current supply end 12 to be symmetrical with respect to the first current supply end 12 so that a line connecting the pair of voltage output ends 14 and 15 is perpendicular to a line connecting the pair of the second current supply ends 11 and 13. Accordingly, as illustrated in FIG. 1A, the voltage output ends 14 and 15 and the current supply ends 11 to 13 are arranged to form a cross.

Through application of voltage to the current supply end 12 at the center of the cross, current flows from the first current supply end 12 to the second current supply ends 11 and 13 via the buried layer 106. Then, at this time, current containing a component perpendicular to a surface of the epitaxial layer 104 flows from the first current supply end 12 to the buried layer 106. While such current is flowing, a magnetic field is applied in a direction in parallel with the surface of the epitaxial layer 104, that is, in a direction along the line L1-L1, then the current described above detects the magnetic field described above, and Hall voltage is generated in a direction perpendicular both to the current and to the magnetic field, that is, in a direction of the line L2-L2. The generated Hall voltage is detected between the voltage output ends 14 and 15.

Trenches 108 are further formed between the first current supply end 12 and the voltage output ends 14 and 15, respectively. Each of the trenches 108 is filled with an insulating film. A flow of current into a voltage output end leads to reduction in a current component that contributes to output, in this case, reduction in a current component perpendicular to a surface of the substrate 103, which results in reduction in sensitivity. Through formation of the trenches 108 filled with the insulating film between the current supply end 12 and the voltage output ends 14 and 15, respectively, such a flow of current into the voltage output ends 14 and 15 can be prevented. The trenches 108 act as weirs. If the total amount of the current is the same, the current component perpendicular to the substrate surface increases, and thus, the sensitivity is enhanced. Further, for the reason described above, voltage output ends are hitherto required to be away from the current supply ends, but, through formation of the trenches 108, the voltage output ends can be brought closer to the current supply ends without relatively large reduction in sensitivity, which also leads to reduction in chip area and in costs.

Further, the current perpendicular to the substrate surface is the largest immediately below the first current supply end 12. As the distance from the first current supply end 12 increases, the current component sharply reduces. A region in which the extent of the reduction is large exists around the first current supply end 12, and further, outflow/inflow difference of carriers due to the Lorentz force is large in the region, and thus, more charge is accumulated in the region. By bringing the voltage output ends 14 and 15 closer to the current supply end 12 and detecting the voltage in the region in which more charge is accumulated, higher Hall voltage can be obtained to enhance the sensitivity. Further, as illustrated in FIG. 1C, the depth of the voltage output ends 14 and 15 from the substrate surface is larger than the diffusion depth of the first current supply end 12. Through adjustment of the depth, the magnetic field can be detected in the region in which the Hall voltage is high. It is necessary that the depth of the trenches 108 be equal to or larger than that of the voltage output ends 14 and 15 so that the effect may be satisfactorily enjoyed.

Note that, in FIG. 1A to FIG. 1C, the epitaxial layer 104 is used as the n-type semiconductor layer serving as the magnetic sensing portion, but, instead of the epitaxial layer, a well layer may be formed and used.

Figure 7A:
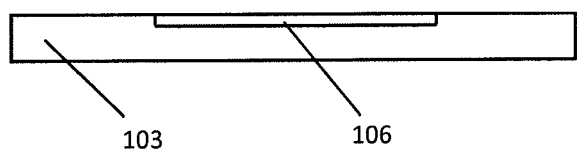
FIG. 7A to FIG. 7D are sectional views for illustrating steps for manufacturing the vertical Hall element according to the first embodiment of the present invention in order of succession.
Figure 7B:
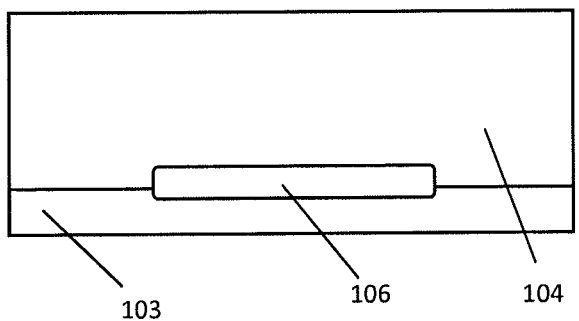
Figure 7C:
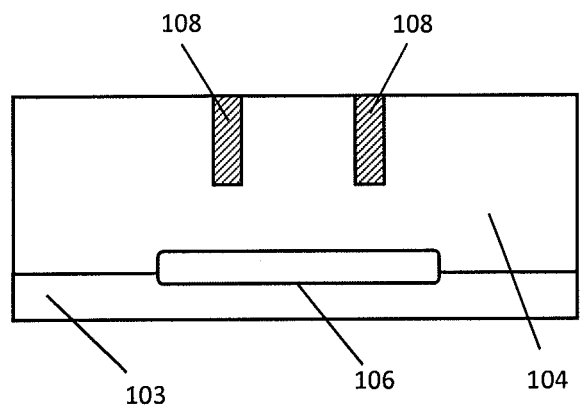
Figure 7D:
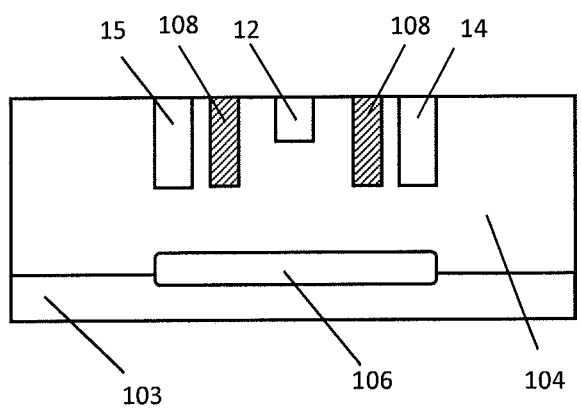

FIG. 7A to FIG. 7D are sectional views for illustrating steps for manufacturing the vertical Hall element according to the first embodiment in order of succession. First, the p-type semiconductor substrate 103 is doped with phosphorus (P), arsenic (As), or antimony (Sb) to form the n-type buried layer 106 having a doping concentration of $5\times10^{17}$/cm$^3$ to $5\times10^{19}$/cm$^3$ (FIG. 7A). Then, as illustrated in FIG. 7B, after the buried layer 106 is formed, the epitaxial layer 104 doped with P serving as the magnetic sensing portion is formed so as to have a doping concentration of $1\times10^{14}$/cm$^3$ to $5\times10^{17}$/cm$^3$. The buried layer 106 has a thickness of from 2 μm to 10 μm, and the epitaxial layer 104 has a thickness of from 2 μm to 15 μm. After the epitaxial layer 104 is formed, as illustrated in FIG. 7C, the trenches 108 are formed by dry etching or the like. Each of the trenches 108 is, after being formed by etching, filled with the insulating film such as an oxide film by CVD or the like. Ordinarily, planarization by CMP is carried out thereafter. Then, the heavily doped impurity layer (with As, P, or the like) serving as the current supply ends 11 to 13 and the voltage output ends 14 and 15 is formed, and diffusion is carried out by heat treatment (FIG. 7D). The depth of the voltage output ends 14 and 15 may be further adjusted through doping of the voltage output ends 14 and 15 with P or the like using additional energy to obtain optimum sensitivity.

Second Embodiment

Figure 2A:
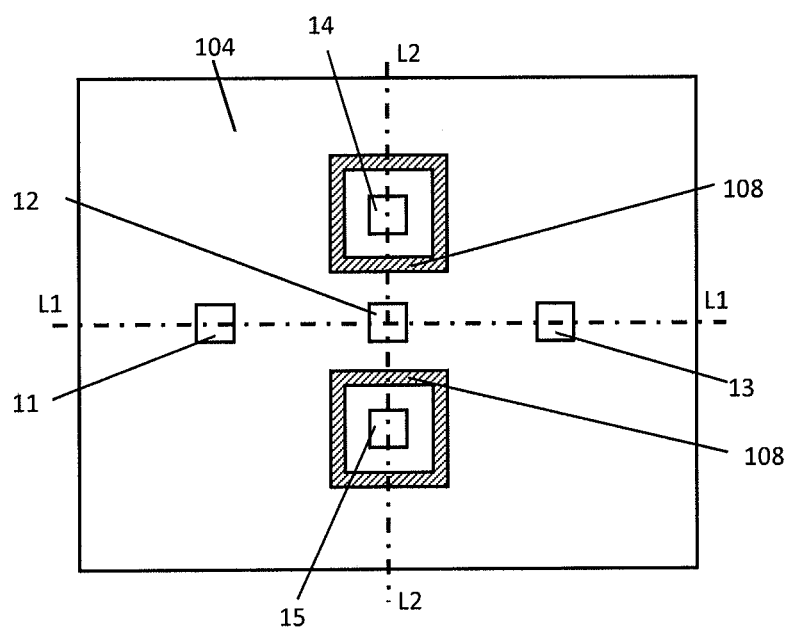
FIG. 2A to FIG. 2C are schematic views for illustrating a vertical Hall element according to a second embodiment of the present invention.
Figure 2B:
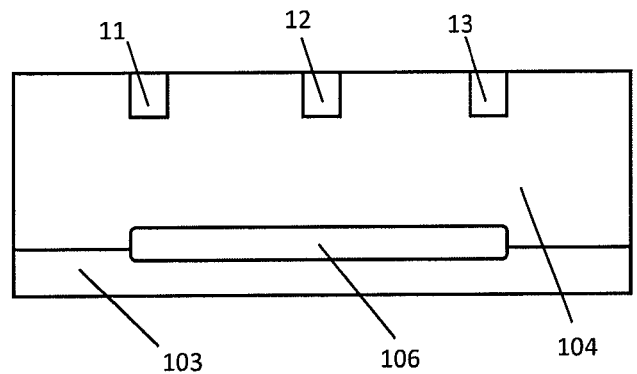
Figure 2C:
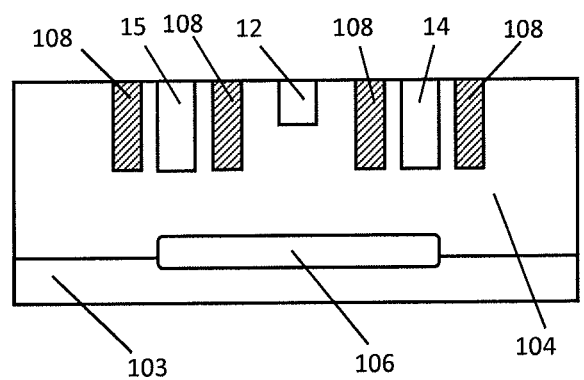

FIG. 2A to FIG. 2C are schematic views for illustrating a vertical Hall element according to a second embodiment of the present invention. FIG. 2A is a plan view, FIG. 2B is a sectional view taken along the line L1-L1 of FIG. 2A, and FIG. 2C is a sectional view taken along the line L2-L2 of FIG. 2A.

The second embodiment is different from the first embodiment in the shape of the trenches 108 formed between the voltage output ends 14 and 15 and the current supply end 12, respectively, and the rest of the structure is the same as that of the first embodiment. With reference to FIG. 2A, the trenches 108 are shaped so as to surround the voltage output ends 14 and 15, respectively, in plan view. This can restrict a flow of current into the voltage output ends 14 and 15 with more reliability to enhance the sensitivity. In FIG. 2A, the trenches 108 are shaped so as to completely surround the voltage output ends 14 and 15, respectively, but the trenches 108 may be shaped so as to partly surround the voltage output ends 14 and 15, respectively. Specifically, the trenches 108 may be U-shaped or in the shape of a semicircular arc so as to partly surround the voltage output ends 14 and 15 between the current supply end 12 and the voltage output ends 14 and 15, respectively.

Similarly to the case of the first embodiment, the depth of the voltage output ends 14 and 15 from the substrate surface is larger than the diffusion depth of the first current supply end 12 as illustrated in FIG. 2C. Through adjustment of the depth, the magnetic field can be detected in the region in which the Hall voltage is high. It is necessary that the depth of the trenches 108 be equal to or larger than that of the voltage output ends 14 and 15 so that the effect may be satisfactorily enjoyed.

Further, also in this embodiment, similarly to the case of the first embodiment, a well layer may be formed and used instead of the epitaxial layer 104.

Third Embodiment

Figure 3A:
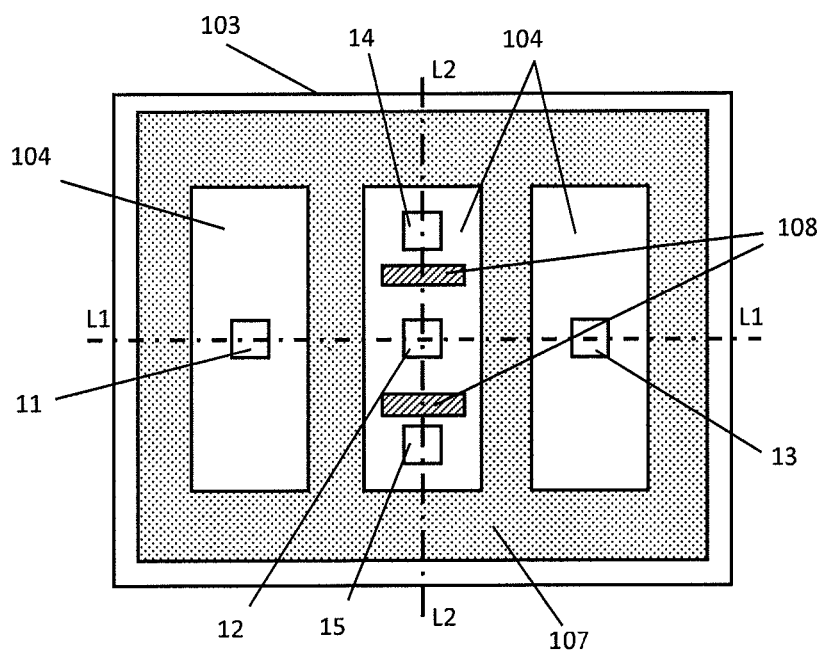
FIG. 3A to FIG. 3C are schematic views for illustrating a vertical Hall element according to a third embodiment of the present invention.
Figure 3B:
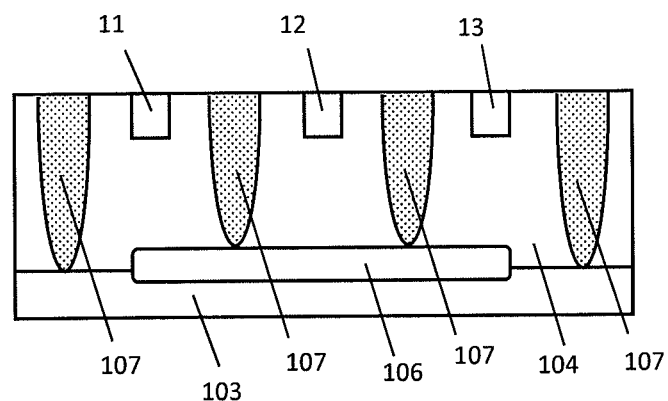
Figure 3C:
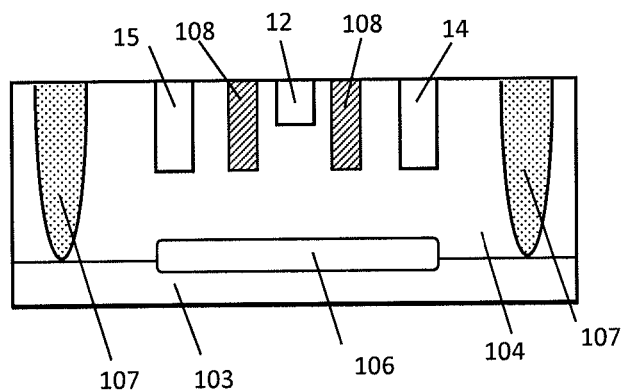
Figure 4:
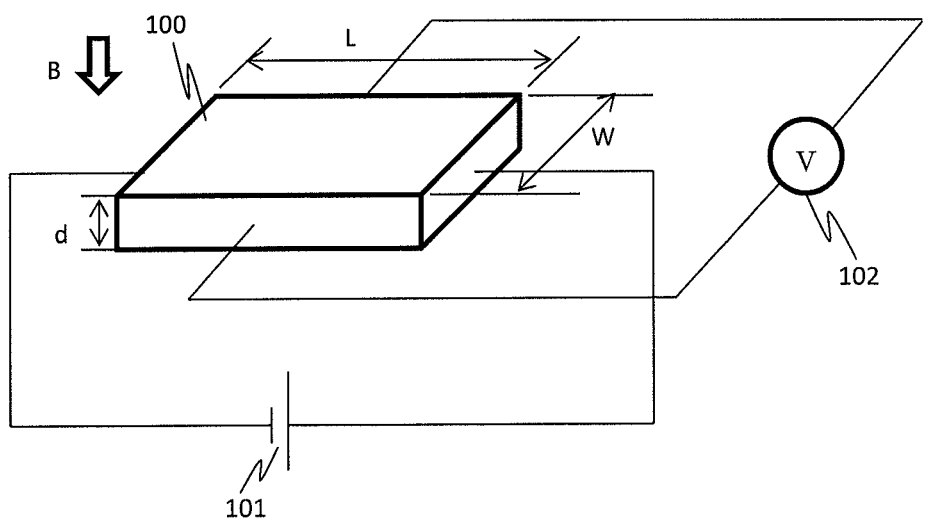
FIG. 4 is a schematic view for illustrating a structure of a Hall element.
Figure 5A:
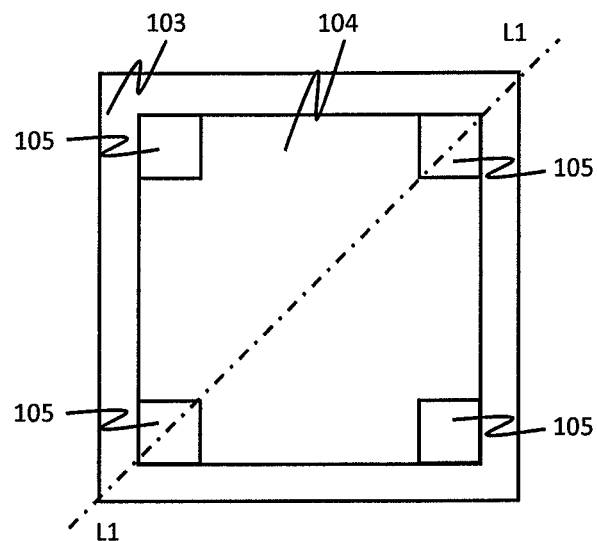
FIG. 5A and FIG. 5B are schematic views for illustrating a related-art horizontal Hall element.
Figure 5B:
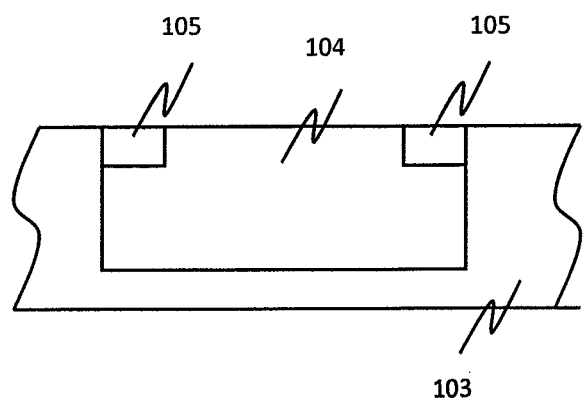
Figure 6A:
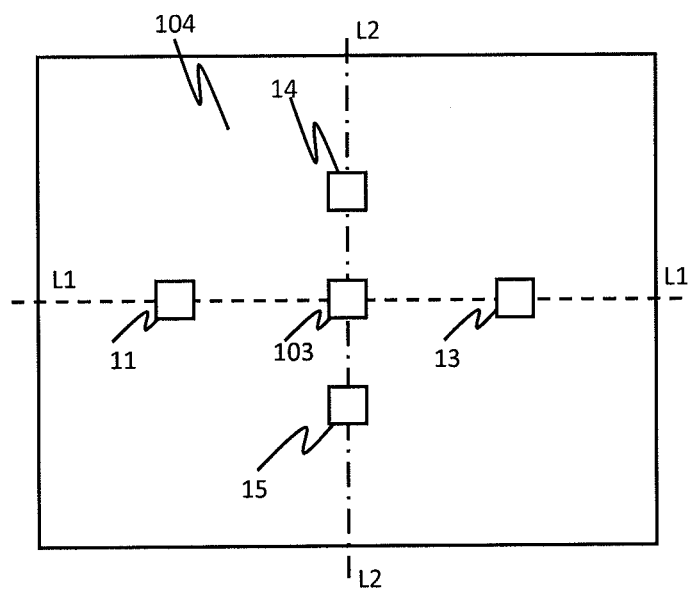
FIG. 6A to FIG. 6C are schematic views for illustrating a related-art vertical Hall element.
Figure 6B:
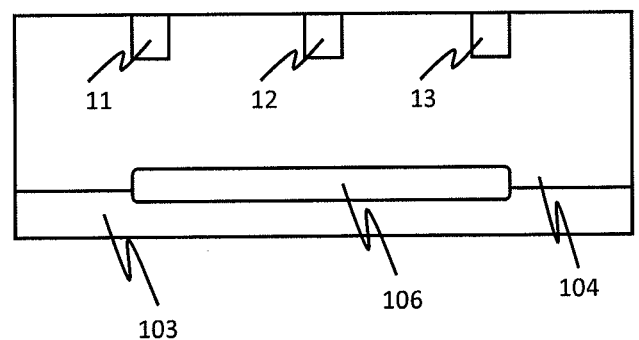
Figure 6C:
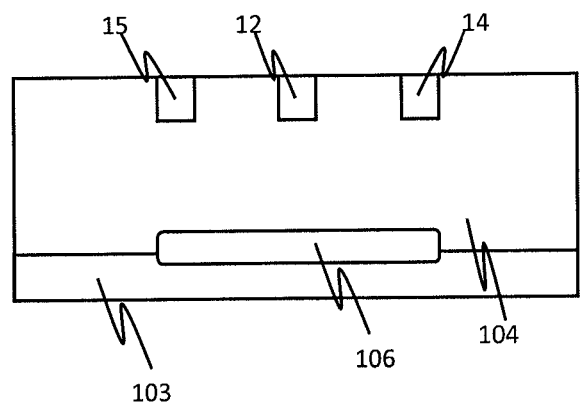

FIG. 3A to FIG. 3C are schematic views for illustrating a vertical Hall element according to a third embodiment of the present invention. FIG. 3A is a plan view, FIG. 3B is a sectional view taken along the line L1-L1 of FIG. 3A, and FIG. 3C is a sectional view taken along the line L2-L2 of FIG. 3A.

This embodiment is different from the first embodiment in a diffused separating wall 107 that is a heavily doped p-type impurity region formed so as to separate the three current supply ends 11 to 13 from one another, and the rest of the structure is the same as that of the first embodiment. The p-type diffused separating wall 107 is formed so as to surround the current supply end 11 and to surround the current supply end 13, and further, to surround the current supply end 12, the voltage output ends 14 and 15, and the trenches 108. As a result, the diffused separating wall 107 is a diffused region having three windows that have no p-type impurity diffused therein. The p-type diffused separating wall 107 is formed so deep that tips thereof in a depth direction may reach the buried layer 106. The existence of the p-type diffused separating wall 107 electrically separates the current supply ends 11 to 13 from one another, which enables the current component perpendicular to the substrate surface to be obtained with more reliability to enhance the sensitivity. Most of the current flowing between the current supply end 11 and the current supply end 12 and between the current supply end 12 and the current supply end 13 flows in the depth direction of the substrate and then flows via the buried layer 106, which can contribute to generation of the Hall voltage.

Further, in this case, a structure without the buried layer 106 can also obtain the current component described above, and thus, reduction of offset due to misalignment of the buried layer 106 can be expected.

Still further, also in this embodiment, similarly to the case of the second embodiment illustrated in FIG. 2A to FIG. 2C, the trenches 108 may be shaped so as to surround the voltage output ends 14 and 15, respectively, which is also effective.

Further, also in this case, similarly to the case of the first embodiment, a well layer may be formed and used instead of the epitaxial layer 104.

Fourth Embodiment

Figure 8A:
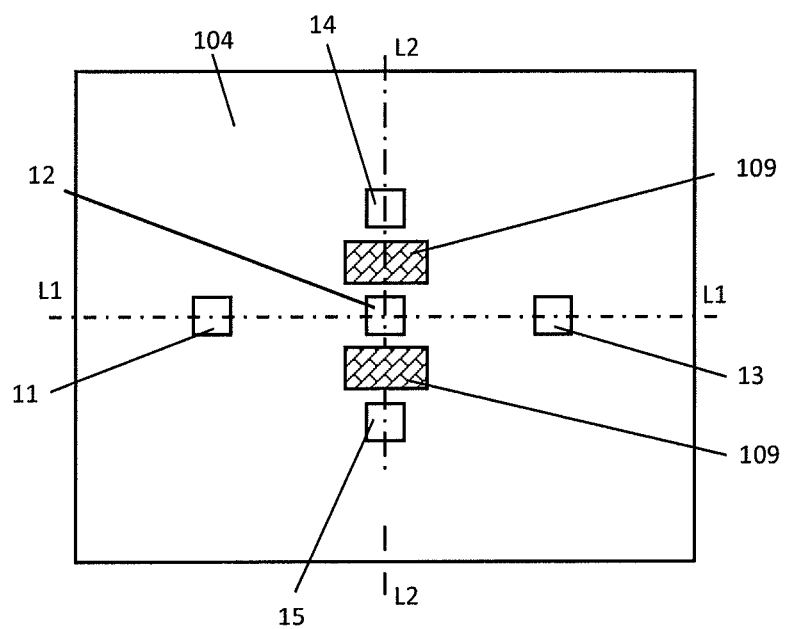
FIG. 8A to FIG. 8C are schematic views for illustrating a vertical Hall element according to a fourth embodiment of the present invention.
Figure 8B:
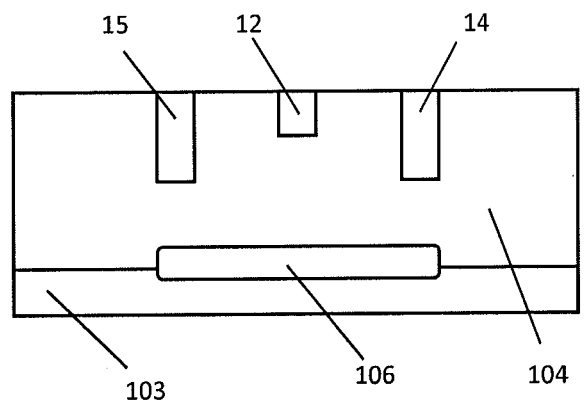
Figure 8C:
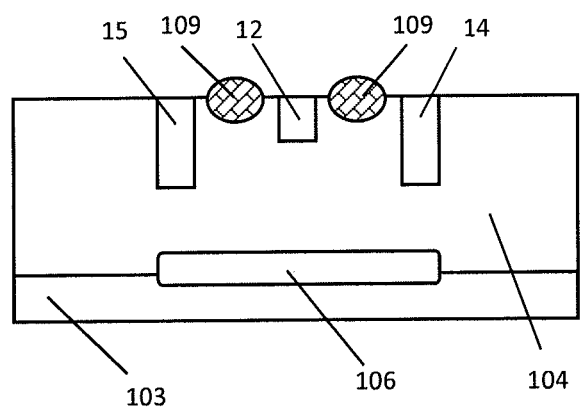

FIG. 8A to FIG. 8C are schematic views for illustrating a vertical Hall element according to a fourth embodiment of the present invention. FIG. 8A is a plan view, FIG. 8B is a sectional view taken along the line L1-L1 of FIG. 8A, and FIG. 8C is a sectional view taken along the line L2-L2 of FIG. BA.

As is distinctively illustrated in FIG. 8C, this embodiment is different from the first embodiment in that the trenches 108 between the current supply end 12 and the voltage output ends 14 and 15, respectively, in the first embodiment are replaced by a thick field insulating film that is generally used for separating elements and that is formed by a LOCOS method, and the rest of the structure is the same as that of the first embodiment.

Fifth Embodiment

Figure 9A:
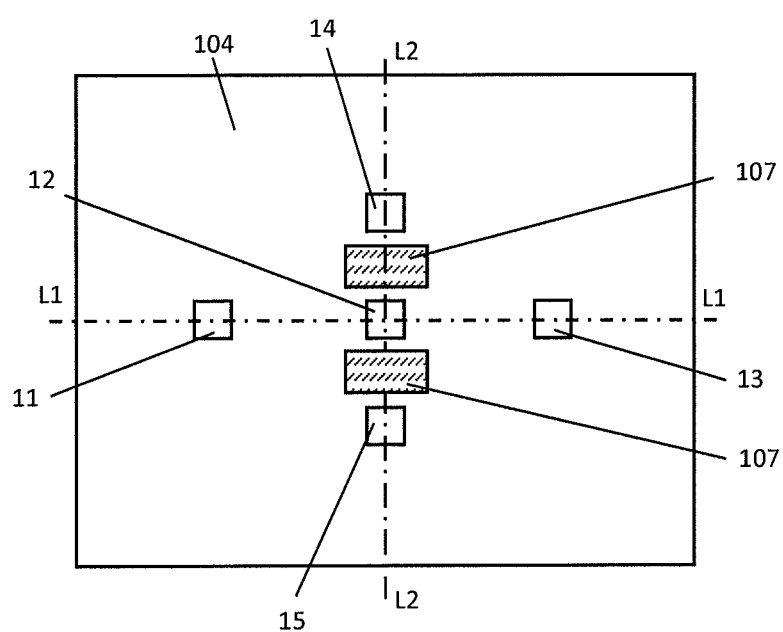
FIG. 9A to FIG. 9C are schematic views for illustrating a vertical Hall element according to a fifth embodiment of the present invention.
Figure 9B:
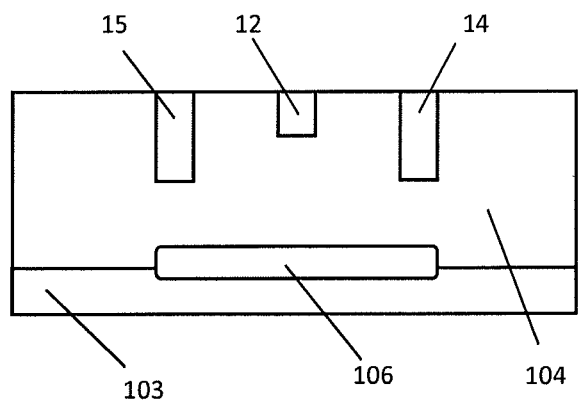
Figure 9C:
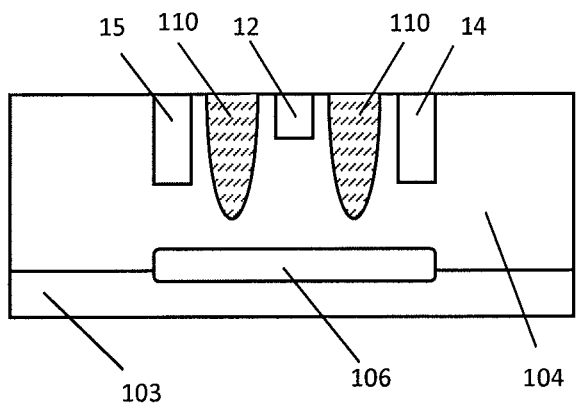

FIG. 9A to FIG. 9C are schematic views for illustrating a vertical Hall element according to a fifth embodiment of the present invention. FIG. 9A is a plan view, FIG. 9B is a sectional view taken along the line L1-L1 of FIG. 9A, and FIG. 9C is a sectional view taken along the line L2-L2 of FIG. 9A.

This embodiment is different from the first embodiment in that the trenches 108 between the current supply end 12 and the voltage output ends 14 and 15, respectively, are replaced by p-type diffused separating walls 107, and the rest of the structure is the same as that of the first embodiment. It is desired that the depth of the diffused separating walls 107 between the current supply end 12 and the voltage output ends 14 and 15, respectively, be equal to or larger than that of the voltage output ends 14 and 15.

Sixth Embodiment

Figure 10A:
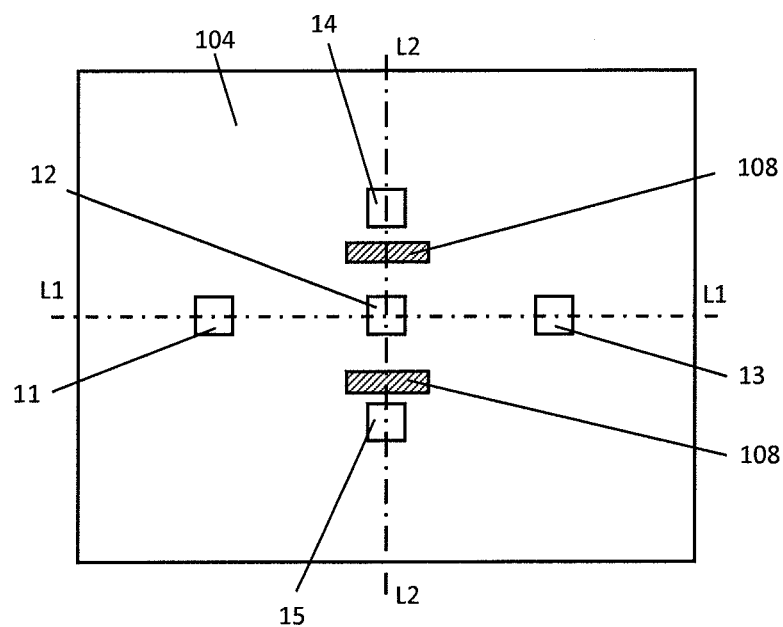
FIG. 10A to FIG. 10C are schematic views for illustrating a vertical Hall element according to a sixth embodiment of the present invention.
Figure 10B:
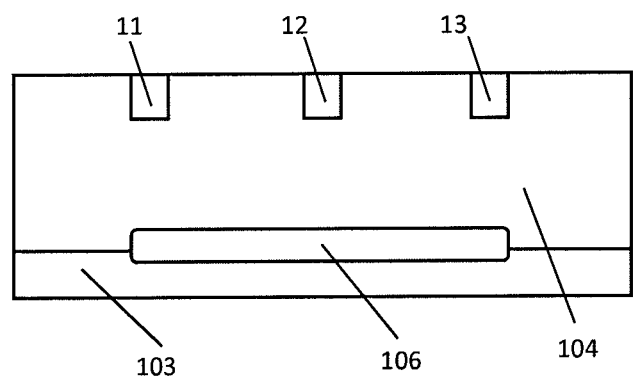
Figure 10C:
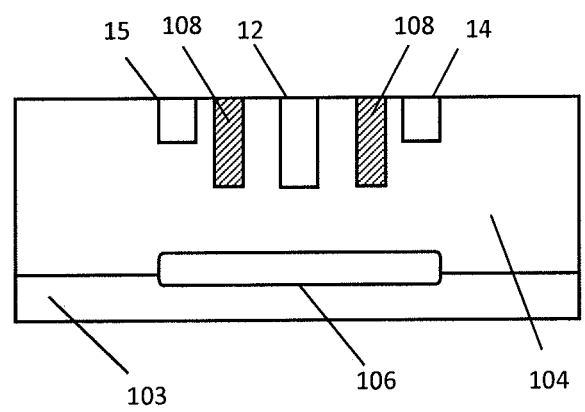

FIG. 10A to FIG. 10C are schematic views for illustrating a vertical Hall element according to a sixth embodiment of the present invention. FIG. 10A is a plan view, FIG. 10B is a sectional view taken along the line L1-L1 of FIG. 10A, and FIG. 10C is a sectional view taken along the line L2-L2 of FIG. 10A.

This embodiment is different from the first embodiment in that the diffusion depth of the first current supply end 12 from the substrate surface is equal to or larger than that of the voltage output ends 14 and 15, and the rest of the structure is the same as that of the first embodiment. Through adjustment of the depth of a diffused layer forming the current supply end 12, optimum sensitivity can be obtained.

What is claimed is:

1. A vertical Hall element, comprising:
   a semiconductor substrate;
   an n-type semiconductor layer formed on the semiconductor substrate;
   an n-type buried layer formed at a bottom of the n-type semiconductor layer;
   a first current supply end formed above the n-type buried layer;
   a pair of second current supply ends formed in a surface of the n-type semiconductor layer on both sides of the first current supply end to be symmetrical with respect to the first current supply end;
   a pair of voltage output ends formed in the surface of the n-type semiconductor layer on both sides of the first current supply end to be symmetrical with respect to the first current supply end so that a line connecting the pair of voltage output ends is perpendicular to a line connecting the pair of second current supply ends; and
   trenches formed in the n-type semiconductor layer between the first current supply end and one of the pair of voltage output ends and between the first current supply end and another of the pair of voltage output ends, respectively, each of the trenches being filled with an insulating film.

2. A vertical Hall element according to claim 1, wherein the trenches surround at least part of the pair of voltage output ends, respectively.

3. A vertical Hall element according to claim 1, wherein the trenches completely surround the pair of voltage output ends, respectively.

4. A vertical Hall element according to claim 1, wherein the trenches have a depth that is equal to or larger than a diffusion depth of the pair of voltage output ends.

5. A vertical Hall element according to claim 1, wherein the pair of voltage output ends have a depth that is larger than a diffusion depth of the first current supply end.

6. A vertical Hall element according to claim 1, wherein the pair of voltage output ends have a depth that is equal to or smaller than a diffusion depth of the first current supply end.

7. A vertical Hall element, comprising:
   a semiconductor substrate;
   an n-type semiconductor layer formed on the n-type semiconductor substrate;
   an n-type buried layer formed at a bottom of the n-type semiconductor layer;
   a first current supply end formed above the n-type buried layer;
   a pair of second current supply ends formed in a surface of the n-type semiconductor layer on both sides of the first current supply end to be symmetrical with respect to the first current supply end;
   a pair of voltage output ends formed in the surface of the n-type semiconductor layer on both sides of the first current supply end to be symmetrical with respect to the first current supply end so that a line connecting the pair of voltage output ends is perpendicular to a line connecting the pair of second current supply ends; and
   field insulating films formed in the n-type semiconductor layer between the first current supply end and one of the pair of voltage output ends and between the first current supply end and another of the pair of voltage output ends, respectively.

8. A vertical Hall element according to claim 7, wherein the field insulating films surround at least part of the pair of voltage output ends, respectively.

9. A vertical Hall element according to claim 7, wherein the field insulating films completely surround the pair of voltage output ends, respectively.

10. A vertical Hall element according to claim 7, wherein the field insulating films have a depth that is equal to or larger than a diffusion depth of the pair of voltage output ends.

11. A vertical Hall element according to claim 7, wherein the pair of voltage output ends have a depth that is larger than a diffusion depth of the first current supply end.

12. A vertical Hall element according to claim 7, wherein the pair of voltage output ends have a depth that is equal to or smaller than a diffusion depth of the first current supply end.

13. A vertical Hall element, comprising:
   a semiconductor substrate;
   an n-type semiconductor layer formed on the semiconductor substrate;
   an n-type buried layer formed at a bottom of the n-type semiconductor layer;
   a first current supply end formed above the n-type buried layer;
   a pair of second current supply ends formed in a surface of the n-type semiconductor layer on both sides of the first current supply end to be symmetrical with respect to the first current supply end;
   a pair of voltage output ends formed in the surface of the n-type semiconductor layer on both sides of the first current supply end to be symmetrical with respect to the first current supply end so that a line connecting the pair of voltage output ends is perpendicular to a line connecting the pair of second current supply ends; and
   p-type diffusion layers formed in the n-type semiconductor layer between the first current supply end and one of the pair of voltage output ends and between the first current supply end and another of the pair of voltage output ends, respectively.

14. A vertical Hall element according to claim 13, wherein the p-type diffusion layers surround at least part of the pair of voltage output ends, respectively.

15. A vertical Hall element according to claim 13, wherein the p-type diffusion layers completely surround the pair of voltage output ends, respectively.

16. A vertical Hall element according to claim 13, wherein the p-type diffusion layers have a depth that is larger than a diffusion depth of the pair of voltage output ends.

17. A vertical Hall element according to claim 13, wherein the pair of voltage output ends have a depth that is larger than a diffusion depth of the first current supply end.

18. A vertical Hall element according to claim 13, wherein the pair of voltage output ends have a depth that is equal to or smaller than a diffusion depth of the first current supply end.

* * * * *